United States Patent [19]

Kondo et al.

[11] Patent Number: 5,040,239
[45] Date of Patent: Aug. 13, 1991

[54] TUNING CIRCUIT AND RECEIVER

[75] Inventors: Hiroshi Kondo; Takeyuki Kouchi, both of Saitama, Japan

[73] Assignee: Toko, Inc., Tokyo, Japan

[21] Appl. No.: 398,170

[22] Filed: Aug. 23, 1989

[30] Foreign Application Priority Data

Aug. 30, 1988 [JP] Japan .................. 53-215754

[51] Int. Cl.$^5$ ............................... H04B 1/18
[52] U.S. Cl. .................... 455/193; 455/195; 455/183; 334/12
[58] Field of Search ................ 455/192–193, 455/195, 183, 196; 334/12; 336/83, 119, 136, 212

[56] References Cited

U.S. PATENT DOCUMENTS

| 3,571,716 | 3/1971 | Hill et al. | 455/193 |
|---|---|---|---|
| 3,579,115 | 5/1971 | Goncharoff et al. | 455/195 |
| 3,600,684 | 8/1971 | Cherry | 455/195 |
| 4,403,347 | 9/1983 | Iso et al. | 55/193 |
| 4,450,588 | 5/1984 | Pöhrich et al. | 455/193 |
| 4,630,013 | 12/1986 | Takada | 334/12 |
| 4,725,805 | 2/1988 | Takada | 336/83 |
| 4,739,517 | 4/1988 | Okanobu | 455/193 |
| 4,748,683 | 5/1988 | Sato | 455/192 |

Primary Examiner—Reinhard J. Eisenzopf
Assistant Examiner—Andrew Faile

[57] ABSTRACT

In a tuning circuit, use is made of a current-controlled type variable inductor comprising a tuning coil and a control coil for controlling the magnetic flux density of the tuning coil. The tuning coil is connected in series with the antenna; a tuning capacitor is connected to each end of tuning coil; and by controlling a current flowing through the control coil, magnetic flux induced in the tuning coil is increased, decreased or cancelled so that the magnetic flux density of the tuning coil is adjusted to control the inductance thereof, thereby permitting the tuning circuit to be tuned to any desired frequency in the receiving frequency band.

4 Claims, 4 Drawing Sheets

TUNING CIRCUIT AND RECEIVER

BACKGROUND OF THE INVENTION

1. Field of the Invention

This invention relates to a tuning circuit using a current-controlled variable inductor comprising a tuning coil and a control coil for controlling the inductance of the tuning coil by controlling the magnetic flux density thereof, and it also pertains to a receiver using such a tuning circuit.

With a tuning circuit for a receiver, it has heretofore been the practice to employ either variable capacitance element (variable capacitance diode) or variable inductance element to select receiving frequency. A $\mu$-tuning circuit using variable inductance element is extensively employed with a receiver to be mounted in an automobile, and is predominantly arranged such that the receiving frequency is selected by adjusting the inductance of the variable inductance element by moving the magnetic core of the radio frequency coil incorporated in the variable inductance element. More specifically, such a $\mu$-tuning circuit is so designed as to be tuned to the desired receiving frequency by moving the rod-like magnetic core relative to the tuning coil to control the magnetic flux density thereof, thereby changing the inductance of the tuning coil.

2. Description of the Prior Art:

To have a better understanding of the present invention, description will first be made of the front-end section of a receiver using a conventional $\mu$-tuning circuit which is schematically illustrated in FIG. 1 of the accompanying drawings and which includes an antenna 1, an antenna tuning circuit 30, an RF amplifier 31, and a radio frequency tuning circuit 32. A capacitor $C_0$ is provided to achieve impedance matching between the antenna 1 and the tuning circuit. The $\mu$-tuning circuit of the antenna tuning circuit is arranged such that tuning is effected by displacing the magnetic core of the tuning coil to control the inductance of the tuning coil, and it is also designed such that the range over which the inductance of the tuning coil $L_{10}$ is variable, is set up to meet such a condition as defined by the following relationship between the receiving frequency and the inductance:

$$f\text{max}^2/f\text{min}^2 = L\text{max}/L\text{min}. \tag{1}$$

where fmax and fmin represent the maximum and minimum receiving frequencies respectively; and Lmax and Lmin denote the maximum and minimum values for the inductance of the variable tuning coils $L_{10}$ and $L_{11}$ respectively.

As mentioned above, the conventional variable inductance type tuning coil, or $\mu$-tuning circuit is so arranged as to be tuned to the desired receiving frequency by manually changing the position of the magnetic core to control the magnetic flux density, or inductance of the tuning coil. Thus, the conventional $\mu$-tuning circuit disadvantageous in that expensive mechanical means is required for mechanically moving the magnetic core to permit the tuning circuit to be tuned to a designed receiving frequency, instead of by using an electric signal.

SUMMARY OF THE INVENTION

A primary object of the present invention is to provide a tuning circuit using a current-controlled type variable inductor which is tunable to a desired receiving frequency by means of current control, and a receiving incorporating such a tuning circuit.

Another object of the present invention is to provide a tuning circuit using a current-controlled type variable inductor incorporating a circuit system well suited for control current supply to effect receiving frequency selection, and a receiver employing such a tuning circuit.

The tuning circuit according to the present invention uses a current-controlled type variable inductor comprising a tuning coil and a control coil for controlling the magnetic flux density of the tuning coil, as disclosed in U.S. Pat. No. 4,630,013 and No. 4,725,805. The tuning coil is connected in series with the antenna; a tuning capacitor is connected to each end of the tuning coil; and by controlling a current flowing through the control coil, magnetic flux induced in the tuning coil is increased, decreased or cancelled so that the magnetic flux density of the tuning coil is adjusted to control the inductance of the tuning coil, thereby permitting the tuning circuit to be tuned to any desired frequency in the receiving frequency band.

Control of the current supplied to the control coil can be manually achieved by using a volume or the like can be achieved. A signal corresponding to a pre-stored receiving frequency is passed to a D/A converter through a central processing unit (CPU) and then converted to a control current to be supplied to the control coil.

Other objects, features and advantages of the present invention will become apparent from the ensuing description taken in conjunction with the accompanying drawings.

DESCRIPTION OF THE PREFERRED EMBODIMENTS

Figure 1:
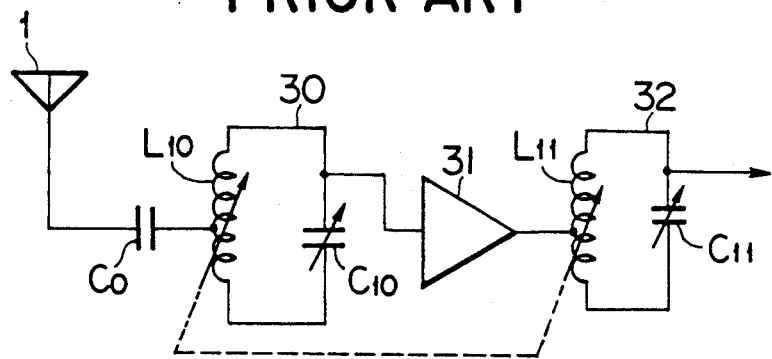
FIG. 1 is a schematic circuit diagram of the conventional $\mu$-tuning circuit.
Figure 2:
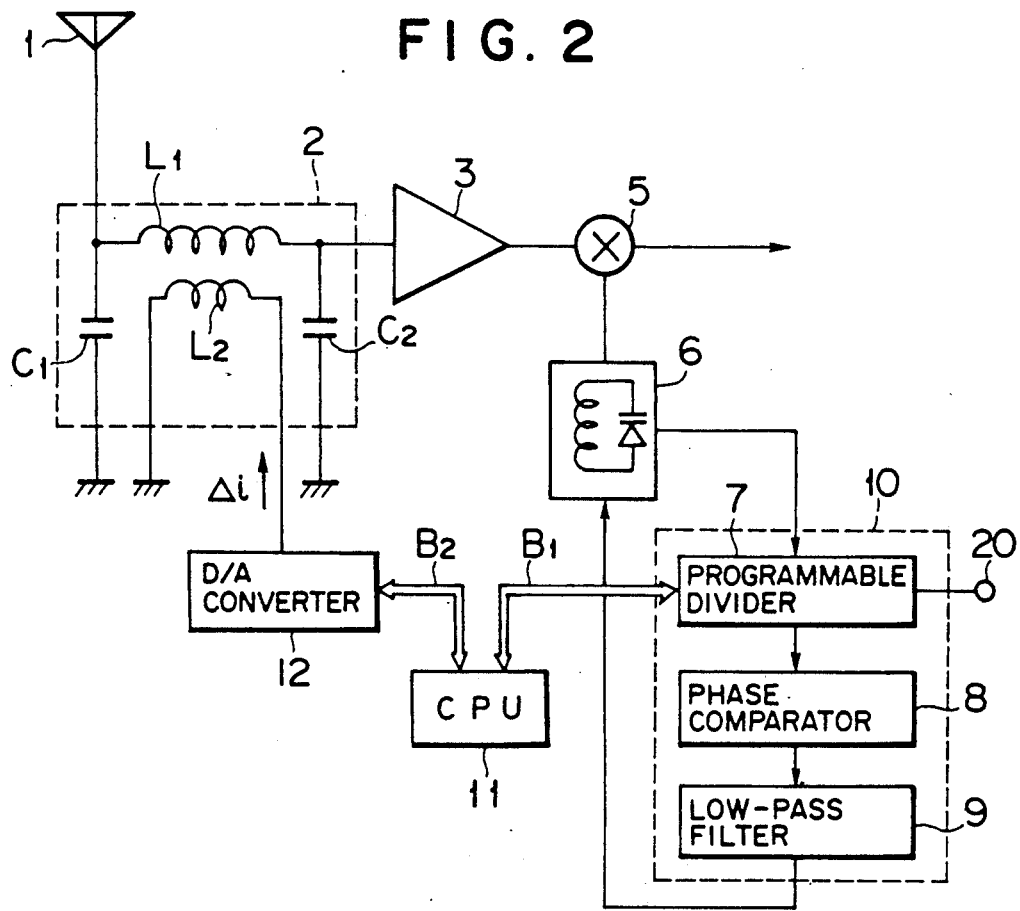
FIG. 2 is a circuit diagram showing the receiver including an antenna tuning circuit using a current-controlled type variable inductor according to an embodiment of this invention.

Referring to FIG. 2, the circuit arrangement shown therein includes an antenna 1, an antenna tuning circuit 2, a radio frequency amplifier 3, a mixer circuit 5, a local oscillator circuit 6, and a PLL synthesizer 10. The PLL synthesizer 10 comprises a programmable divider 7 which is set up by a digital signal provided at a control terminal 20; a phase comparator 8; and a low-pass filter 9. A CPU 11 transmits a signal to the PLL synthesizer 10 and D/A converter 12 through bus lines $B_1$ and $B_2$.

The antenna tuning circuit 2 uses a current-controlled type variable inductor comprising a tuning coil $L_1$ and control coil $L_2$. The antenna tuning circuit 2 is composed of the tuning coil $L_1$ and tuning capacitors $C_1$, $C_2$ connected to the opposite ends of the tuning coil $L_1$. In the current-controlled variable inductor, the control coil $L_2$ for adjusting the magnetic flux density of the tuning coil $L_1$ is disposed in proximity thereto, and by controlling a control current $\Delta i$ flowing through the control coil $L_2$, the magnetic flux density in the tuning coil $L_1$ is adjusted so that the inductance thereof is adjusted. In this way, a tuning frequency of the antenna tuning circuit is adjusted to the desired frequency.

Figure 3:
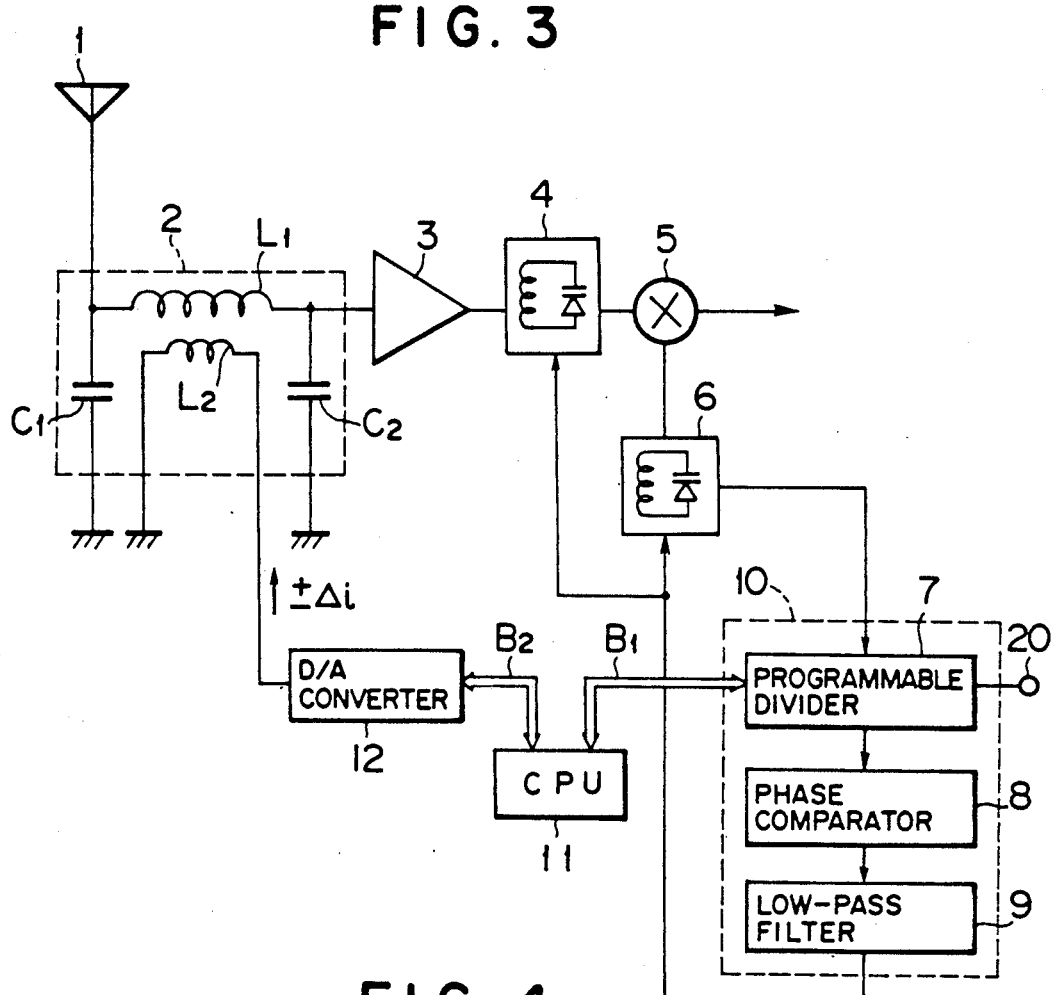
FIG. 3 is a circuit diagram showing the receiver including an antenna tuning circuit using a current-controlled type variable inductor according to a second embodiment of this invention.

Referring to FIG. 3, there is shown the receiver according to another embodiment of this invention, which constitutes a modification to the embodiment of FIG. 2 in that a high frequency tuning circuit 4 including a variable capacitance diode is provided after the antenna tuning circuit 2. The remaining portion of the circuit arrangement of FIG. 3 is similar to the embodiment of FIG. 2, and therefore further description thereof will be omitted. The tuning circuit shown in FIG. 3 has better receiving characteristics than the embodiment of FIG. 2.

Figure 4:
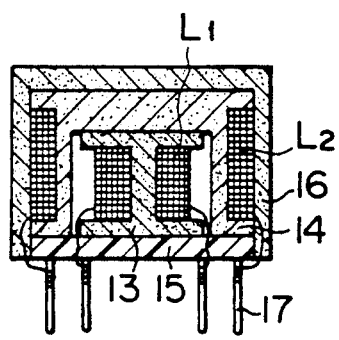
FIG. 4 is a sectional view illustrating an example of the current-controlled variable inductor.

FIG. 4 is a sectional view showing a current-controlled type variable inductor used with the embodiments of FIGS. 2 and 3. Current-controlled type variable inductors are disclosed in U.S. Pat. No. 4,630,013 and No. 4,725,805. An example of such inductors is shown in FIG. 4. The inductor of FIG. 4 comprises a bobbin 13, a tuning coil $L_1$ wound on the bobbin 13, and terminal pins 17 which are securely planted in a base 15. It further comprises a bobbin 14, a control coil $L_2$ wound on the bobbin 14 in such a manner as to surround the tuning coil $L_1$. The opposite ends of the coils are wound onto the terminal pins 17 respectively, and a cup-like magnetic core 16 is disposed in such a manner as to accommodate the control coil $L_2$ therein. By controlling current supplied to the control coil $L_2$, the inductance of the tuning coil $L_1$ can be readily changed in the range of 10.5 $\mu$H to 800 $\mu$H. The current-controlled type variable inductor usable in this invention is not limited to the construction of FIG. 4, but various types of construction will be able to be implemented.

Figure 5:
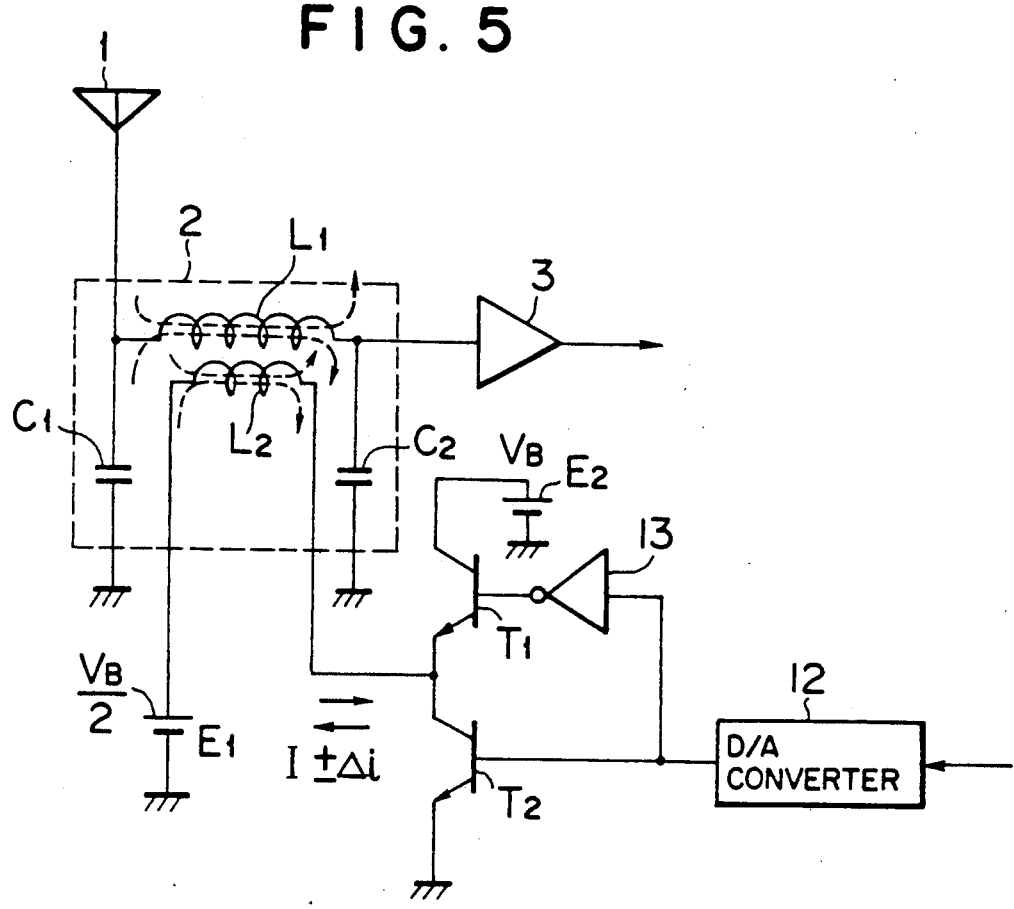
FIG. 5 is a circuit diagram showing an example of circuit for providing control current to be supplied to the current-controlled variable inductor.

Referring to FIG. 5, there is shown an example of circuit for supplying control current $\Delta i$ to the control coil $L_2$ of the antenna tuning circuit 2, wherein a reference voltage source $E_1$ is connected to one end of the control coil $L_2$. The potential of the reference voltage source $E_1$ is set up to be $V_B/2$. The other end of the control coil $L_2$ is a connection point between the emitter of an NPN transistor $T_1$ and the collector of another NPN transistor $T_2$; the collector of the transistor $T_1$ is connected to a second reference voltage source $E_2$ having a potential of $V_B$; and the emitter of the transistor $T_2$ is grounded. The base of the transistor $T_2$ is connected to an inverter 13 having its input terminal connected to a D/A converter 12. The control coil $L_2$ is supplied with control current of $(I \pm \Delta i)$ through the D/A converter 12 so that magnetic flux corresponding to the control current is caused to occur in the control coil $L_2$, and magnetic flux density in the tuning coil $L_1$ is controlled, thereby adjusting the inductance of the tuning coil $L_1$. In this way, the frequency tuned in by the antenna tuning circuit can be adjusted by adjusting the control current $(I \pm \Delta i)$.

Figure 7:
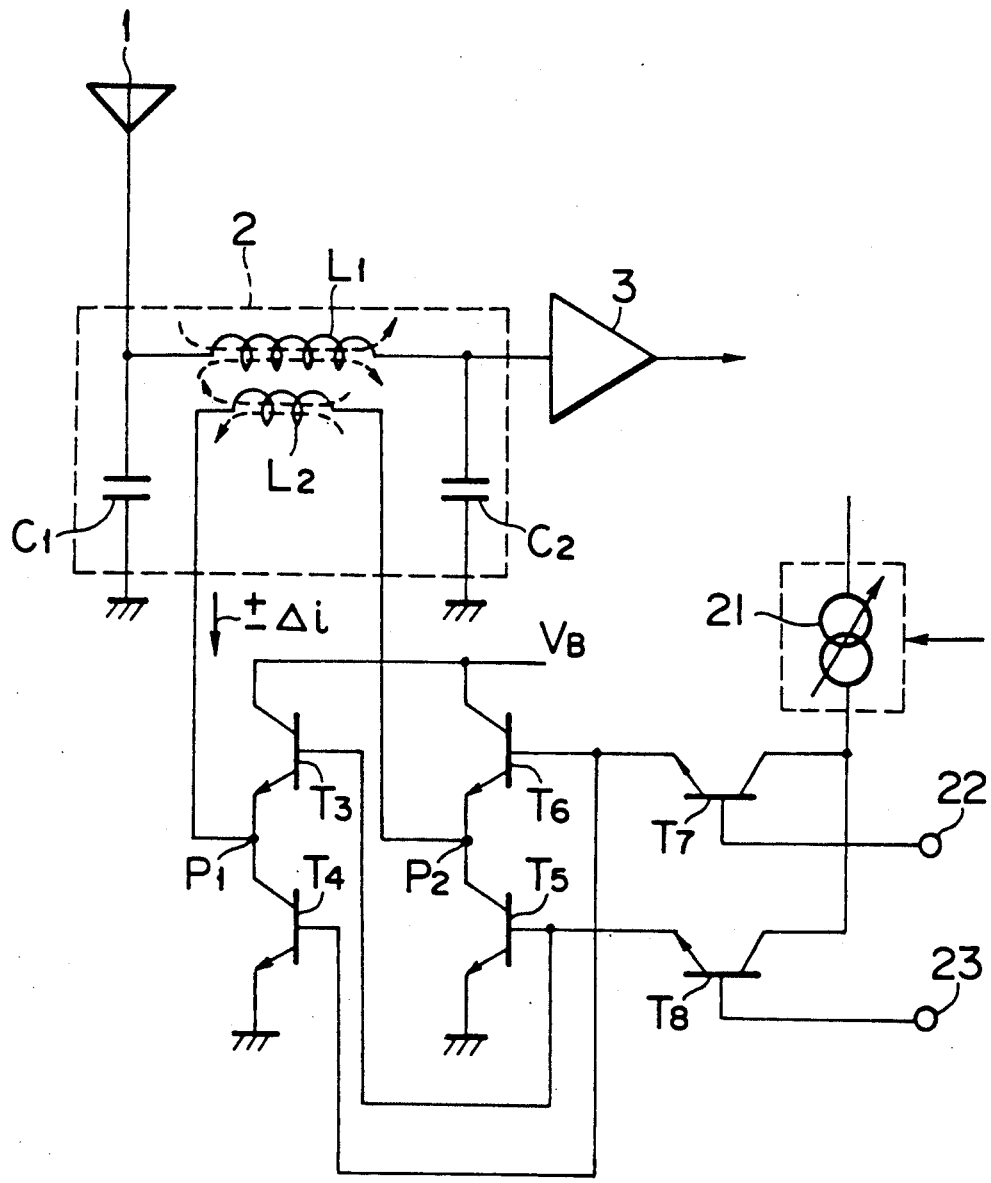
FIG. 7 is a circuit diagram showing another example of circuit for providing control current to the current-controlled variable inductor.

Referring to FIG. 7, there is shown a further embodiment of this invention, wherein a control coil $L_2$ is connected between a connection point $P_1$ between transistors $T_3$, $T_4$ and a connection point $P_2$ between transistors $T_5$, $T_6$; a transistor $T_8$ has its emitter connected to a common connection point between the bases of the transistor $T_3$, $T_5$; a transistor $T_7$ has its emitter connected to a common connection point between the bases of the transistors $T_4$, $T_6$; and the transistors $T_7$, $T_8$ have their collectors connected together which are connected to a variable current source 21 or voltage-current converter circuit. The variable current source 21 may comprise the D/A converter 12 or the like. The base of the transistor $T_7$ is connected to the input terminal 22, and the base of the transistor $T_8$ is connected to the input terminal 23.

Figure 6:
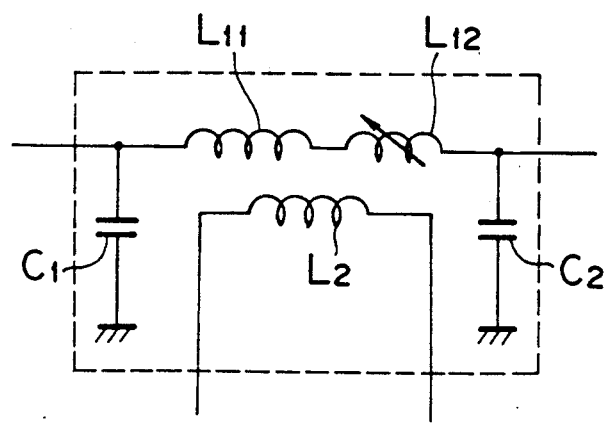
FIG. 6 shows an equivalent circuit of the current-controlled variable inductor.

The tuning coil of the current-controlled type variable inductor employed in FIGS. 2, 3, 5 and 7 may comprise a fixed coil $L_{11}$ and variable coil $L_{12}$ which are connected in series with each other as shown in the equivalent circuit diagram of FIG. 6. Initial magnetic flux density which occurs in the fixed coil $L_{11}$ depending on the receiving frequency band, can be adjusted by changing the inductance of the variable coil $L_{12}$, and thus the tuning frequency band can be adjusted depending on the receiving frequency band.

Although in the embodiments shown in FIGS. 2 and 3, the current supplied to the control coil $L_2$ was controlled by means of the CPU 11 and D/A converter 12, it is also possible that such current control may be effected by using a voltage (tuning voltage)-current converter circuit instead of the D/A converter, and thus the present invention is not limited thereto.

Description will now be made of the operation of the tuning circuit using current-controlled type variable inductor.

Tuning circuit using the current-controlled type variable inductor embodying the present invention may be incorporated in an antenna tuning circuit as shown in FIG. 2, wherein tuning capacitors $C_1$ and $C_2$ are connected to the opposite ends of the tuning coil $L_1$ respectively. Control current $\Delta i$ supplied to the control coil $L_2$ results in magnetic flux being produced therein, and magnetic flux density at the control coil $L_2$ is controlled. In this way, magnetic flux produced in the tuning coil $L_1$ is increased, decreased or cancelled so that magnetic flux density thereat is controlled. The inductance value of the tuning coil $L_1$ is controlled depending on the magnitude of the current supplied to the control coil $L_2$. The magnetic flux density at the tuning coil $L_1$ can be readily changed by reversing the flowing direction of or changing the magnitude of the control current supplied to the control coil $L_2$. An example of such current control is shown in each of the embodiments of FIGS. 5 and 7.

The inductance of the tuning coil $L_1$ is controlled by supplying a control current $(I \pm \Delta i)$ or $(\pm \Delta i)$ to the control coil $L_2$. The inductance value of the tuning coil $L_1$ can be easily set up in the range of 10.5 $\mu$H to 800 $\mu$H. More specifically, the inductance value of the tuning coil $L_1$ is set up depending on the construction of the current-controlled type variable inductor, the number of turns of the coil, the material of the magnetic core and so forth. Such inductance value depends largely on the electrical characteristics of the control coil $L_2$, and thus the inductance of the current-controlled type variable inductor can be readily set up in a desired range. By using such a current-controlled type variable inductor as shown in FIG. 6, selection of receiving frequency can be easily achieved, and the receiving sensitivity can also be enhanced.

Control of the control current $(I \pm \Delta i)$ or $(\pm \Delta i)$ supplied to the current-controlled variable inductor is effected such that the inductor represents inductance corresponding to the control current and the tuning circuit is set at a predetermined tuning frequency so that the desired receiving frequency is selected. An example of such current control is illustrated in FIG. 2, wherein CPU 11 or the like is used; the relationship between the control current and the tuning frequency is memorized in the memory circuit of the CPU 11; and a quantity corresponding to the receiving frequency set by the programmable divider 7 is supplied to the D/A converter 12 to be converted to control current which in turn is supplied to the control coil $L_2$. In this way, the tuning frequency tuned in by the tuning circuit using the current-controlled type variable inductor is set at a predetermined value, and under such a condition, reception is effected.

The resonance frequency of the antenna tuning circuit 2 as illustrated in the embodiments of FIGS. 2 and 3 is given as follows:

$$f = 1/2\pi \sqrt{L(C_1//C_2)} \quad (2)$$

Typically, a capacitor with a capacitance of 2200 pF is used as the tuning capacitor $C_2$, and the combined capacitance of the tuning capacitors $C_1$ and $C_2$ is 150 pF to 200 pF. The resonance frequency for this case can be easily sought from the above equation (2).

For an antenna tuning circuit resonant at a frequency up to (530 to 1710 KHz) in the MW band, the inductance range of the current-controlled type variable inductor can be sought according to the equations (1) and (2) as follows:

$$\begin{aligned} L &= 1/(2\pi f)^2 \times (C_1//C_2) \\ &= 1/(2 \times 530 \times 10^3)^2 \times (180 \times 10^{-12}) \\ &= 501 \ (\mu H) \end{aligned} \quad (3)$$

Thus, for the case where the receiving frequency is 530 KHz, the inductance value of the tuning circuit is calculated to be 501 $\mu$H. For a receiving frequency of 1710 KHz, the required inductance value X of the tuning circuit can be sought according to the equation (1) as follows:

$$f\text{max}^2/f\text{min}^2 = L\text{max}/L\text{min}$$

$$(1710/530)^2 = 501/X$$

$$X = 48.1 \ (\mu H)$$

From the above result, the required inductance value of the tuning circuit for a receiving frequency of 1710 KHz is sought as 48.1 $\mu$H. Consequently, since the inductance of the tuning circuit using the current-controlled variable inductance may readily take a value in the range of 10.5 $\mu$H to 800 $\mu$H; thus it has been verified that an antenna tuning circuit can be constructed which is resonant at a receiving frequency of 530 KHz to 1710 KHz in the MW band.

As will be appreciated from above discussion, the tuning circuit using the current-controlled type variable inductor according to the present invention is arranged such that a control current is supplied to the antenna tuning circuit to change the inductance value of the tuning coil so that the tuning frequency is adjusted to select a desired receiving frequency, as opposed to the conventional antenna tuning circuit using a non-tuning circuit. Thus, according to the present invention, the anti-disturbance characteristics can be highly improved over the conventional receiver. Further, the practical sensitivity of the conventional non-tuning type receiver is about 27 dB$\mu$; in contrast thereto, according to the present invention, the practical sensitivity can be improved to be 22 dB$\mu$ or less.

The $\mu$-tuning circuit is arranged such that tuning is effected by manually mechanically moving the magnetic core of the tuning coil; in contrast thereto, the tuning circuit using current-controlled type variable inductor according to the present invention is arranged such that tuning operation is performed by means of control current and thus facilitated. The tuning circuit according to this invention is well adapted to be used with an electronic tuner since it can be controlled by means of volume or the like and by means of CPU as well.

Furthermore, by virtue of the fact that tuning is effected through current control according to the present invention, it is possible to prevent the tuning point from be deviated because of the magnetic core being displaced due to mechanical vibration as in the case of $\mu$-tuning circuit. This means that the receiver according to the present invention is well adapted to mounted in an automobile.

Still furthermore, the tuning circuit using the current-controlled type variable inductor according to the present invention does not require capacitors connected in series with each other for achieving impedance matching between the antenna and the antenna tuning circuit or a variable capacitance diode for tuning purpose. This decreases the number of the necessary components.

While the present invention has been illustrated and described with respect to some specific embodiments thereof, it is to be understood that the invention is by no means limited thereto but encompasses all changes and modifications which will become possible within the scope of the appended claims.

We claim:

1. A tuning circuit comprising: a current-controlled variable inductor including a tuning coil having two ends, and a control coil for adjusting magnetic flux density of said tuning coil by controlling a control current flowing through said control coil, said control coil being provided in proximity to said tuning coil, thereby controlling inductance value of said tuning coil; a first tuning capacitor of a fixed type connected between one end of said tuning coil connected in series with an antenna and ground; a second tuning capacitor of a fixed type connected between the other end of said tuning coil outputting a receiving frequency and ground; and means for selecting a desired tuning frequency by changing tuning frequency of an antenna tuning circuit including said tuning coil and said first and second tuning capacitors, by supplying said control current to said control coil wherein current supplied to said control coil is controlled by means of a control current supply circuit, thereby controlling the tuning frequency of said tuning circuit, said control current supply circuit being constructed in such a manner that said control coil for adjusting the inductance value of said tuning coil by controlling the magnetic flux density thereof is connected at one end thereof to a connection point between the emitter of a first transistor and the collector of a second transistor; the other end of said control coil is connected to a connection point between the emitter of a third transistor and the collector of a fourth transistor; said first and said third transistor have their collectors connected to a first reference voltage source; and said second and said fourth transistor have their emitters connected to a ground terminal.

2. A tuning circuit comprising: a current-controlled variable inductor including a tuning coil having two ends, and a control coil for adjusting magnetic flux density of said tuning coil by controlling a control current flowing through said control coil, said control coil being provided in proximity to said tuning coil, thereby controlling inductance value of said tuning coil; a first tuning capacity connected between one end of said tuning coil connected in series with an antenna and ground; a second tuning capacitor connected between the other end of said tuning coil outputting a receiving frequency and ground; a first reference voltage source ($V_B/2$) connected at one end of said control coil for adjusting the inductance value of said tuning coil; a first and a second transistor, where the emitter of the first transistor is connected to the collector of the second transistor, the collector of the first transistor is connected to a second reference voltage (Vb), and the emitter of the second transistor is connected to ground, the other end of said control coil being connected to the connection point of the first and second transistors so the control current supplied to said control coil is adjusted.

3. A tuning circuit according to claim 1, wherein the tuning coil comprises a variable coil and a fixed coil which are connected in series with each other.

4. A tuning circuit according to claim 2, wherein the tuning coil comprises a variable coil and a fixed coil which are connected in series with each other.

* * * * *